United States Patent [19]

Lachmann et al.

[11] 4,415,983
[45] Nov. 15, 1983

[54] SYSTEM AND METHOD FOR ALIGNING A DISPLAY DEVICE

[75] Inventors: Leonard P. Lachmann; Cesario S. Garza, Jr., both of Lubbock, Tex.

[73] Assignee: Texas Instruments Incorporated, Dallas, Tex.

[21] Appl. No.: 127,021

[22] Filed: Mar. 4, 1980

[51] Int. Cl.³ ............... G06F 1/00; H05K 1/14
[52] U.S. Cl. ............... 364/708; 200/5 A; 361/395; 361/399
[58] Field of Search ............... 364/708-710; 200/5 A; 361/390, 395, 398, 399, 417; 174/68.5; 29/569 R; 340/365 R

[56] References Cited

U.S. PATENT DOCUMENTS

| | | | |
|---|---|---|---|
| 3,843,851 | 10/1974 | Harada et al. | 200/5 A |
| 3,870,840 | 3/1975 | Rivetta et al. | 200/5 A |
| 4,012,117 | 3/1977 | Lazzery | 350/160 LC |
| 4,104,728 | 8/1978 | Kasubuchi | 200/5 A |
| 4,181,964 | 1/1980 | Moore et al. | 364/708 |
| 4,184,321 | 1/1980 | Tarusawa | 200/5 A |
| 4,231,098 | 10/1980 | Tanimoto | 364/708 |

*Primary Examiner*—Errol A. Krass
*Attorney, Agent, or Firm*—Robert D. Marshall, Jr.; Leo N. Heiting; Melvin Sharp

[57] ABSTRACT

An improved system and method for aligning a display device with a substrate member such as a printed circuit board (PCB) having a plurality of electrical conductors thereon to provide reliable electrical contact between the display device and an electrical circuit mounted on the PCB are described. The display, which is preferably a liquid crystal display (LCD) having a plurality of electrically conductive terminals, is mounted in a base member and biased toward one end of the base member by a spring member mounted on the opposite end of the base member. Spacer material having a pattern of conductors formed on a surface thereof is positioned adjacent to the LCD so that the conductors are in electrical contact with the LCD conductors. The base member further includes a plurality of alignment posts extending outwardly therefrom for mating with respective openings in the PCB to position the PCB with respect to the LCD. When the PCB is properly positioned, the electrical conductors of the PCB are in electrical contact with the conductors of the spacer material, thereby effecting electrical contact between the LCD terminals and the electrical circuit.

23 Claims, 6 Drawing Figures

SYSTEM AND METHOD FOR ALIGNING A DISPLAY DEVICE

BACKGROUND OF THE INVENTION

This invention relates to electrically responsive display devices and in particular to a system for aligning a display device with respect to an external electrical circuit to effect electrical contact therebetween.

Various techniques are known in the art for aligning a display device such as liquid crystal display with an external electrical circuit such as a printed circuit board. Such techniques include bonding a piece of conductive film to the display; positioning the display within a casing of an electronic device such as an electronic calculator and fastening a printed circuit board to the casing so that the display is trapped in contact with the printed circuit board; and attaching the display to a plastic film material with the use of spring clips.

These and other prior art display systems have several disadvantages associated therewith. For example, it is difficult to maintain proper alignment and sufficient contact pressure between the display and the printed circuit board for reliable electrical contact therebetween. It is particularly difficult for large displays having high density conductive patterns formed thereon because generous alignment tolerances present in the system often lead to mismatch between the electrical contacts of the display and those of the printed circuit board. In addition, prior art display systems are not flexible enough to compensate for variations in display dimensions which occur among electronic devices. Further, display assembly is complicated by the fact that the display cannot be tested for proper operation until it is integrated into an end product such as a calculator system. Repair and/or replacement of the display and associated components is often difficult and inconvenient.

SUMMARY OF THE INVENTION

It is therefore one object of the present invention to provide an improved system for aligning an electrically-responsive display device with an external electrical circuit to maintain reliable electrical contact therebetween.

It is another object of the invention to provide a system for aligning liquid crystal displays of various dimensions with a printed circuit board so that reliable electrical contact is effected between the display and the printed circuit board.

It is yet another object of the present invention to provide a display alignment system which is suitable for aligning a large liquid crystal display having a high density conductive pattern etched thereon with a printed circuit board to effect reliable electrical contact therebetween.

It is still another object of the invention to provide a modular display system capable of being tested prior to assembly into an electronic device.

It is a further object of the invention to provide a display system having improved repair and replacement capability.

Still a further object of the present invention is to provide an improved liquid crystal display system for an electronic calculator.

These and other objects are accomplished in accordance with the present invention by providing a system and method for positioning an electrically-responsive display device having a plurality of electrical terminals with respect to a substrate member having an electrical circuit mounted thereon to effectuate electrical contact between the display terminals and the electrical circuit. The system is comprised of a base member for holding the display device in a fixed position therein; spacer material having a pattern of electrical conductors formed on a surface thereof for being disposed adjacent to the display device within the base member so that the conductors of the spacer material are in electrical contact with the display device; and an insulative substrate member having a plurality of electrical conductors formed thereon which are electrically connected to the electrical circuit. Precise alignment is achieved between the display device and the substrate member by positioning the substrate so that a plurality of alignment posts mounted on the base member and extending outwardly therefrom are in mating engagement with respective ones of a plurality of openings extending through the substrate member. When the substrate member is properly positioned with respect to the base member, the electrical conductors of the substrate member are in electrical contact with the conductors of the spacer material, thereby electrically interconnecting the display device with the electrical circuit.

The display device is preferably a liquid crystal display device of the twisted nematic type having a polarizer sheet associated therewith. The substrate member is preferably a printed circuit board. In one embodiment the base member includes a flexible spring member for exerting biasing pressure on the liquid crystal display to maintain the display in a fixed position with respect to a predetermined reference position on the base member. In another embodiment the spacer material is comprised of a pair of compressible rubber strips, which are positioned in contact with the liquid crystal display on opposite sides thereof so that the conductors of each rubber strip are in electrical contact with respective terminals of the display. The rubber strips preferably extend above the liquid crystal display by a predetermined amount so that the printed circuit board will exert biasing pressure thereon to compress the strips against the display so that the display will be held in a fixed position with respect to the printed circuit board and sufficient contact pressure is maintained between the display and the printed circuit board for reliable electrical contact therebetween. In yet another embodiment of the invention the alignment posts are staked to hold the printed circuit board in a fixed position with respect to the base member and the display. The base member further includes a plurality of openings positioned along the perimeter thereof in registration with respective openings in the printed circuit board for allowing the printed circuit board and display to be affixed together by means of screw members, the screw members being removable to permit disengagement of the printed circuit board and the base member.

In a preferred embodiment the base member is a rectangular member having two side members and two end members interconnected to form a hollow chamber therebetween for receiving a liquid crystal display device therein. Each of the side members and end members includes a ridge member projecting therefrom into the chamber along at least a portion of each side and end member for supporting a liquid crystal display when the display is positioned within the chamber. One of the end members has a wedge-shaped spring member comprised of a plastic material projecting therefrom into the chamber for biasing the liquid crystal display toward the other end member. To facilitate positioning of the liquid crystal display and the printed circuit board with respect to the base member, the base member includes a reference indicator marked thereon to indicate the proper orientation of the display and printed circuit board.

The display alignment system of the present invention provides precise alignment and sufficient contact pressure between the liquid crystal display and printed circuit board to maintain reliable electrical contact therebetween under a variety of environmental conditions. The system provides flexibility in the choice of display dimensions and is particularly well-suited for large displays having high density conductive patterns formed thereon. The modular display package provided by the alignment system of the present invention facilitates assemblying and testing of the display system as well as repair and/or replacement thereof.

DETAILED DESCRIPTION OF THE INVENTION

Figure 1A:
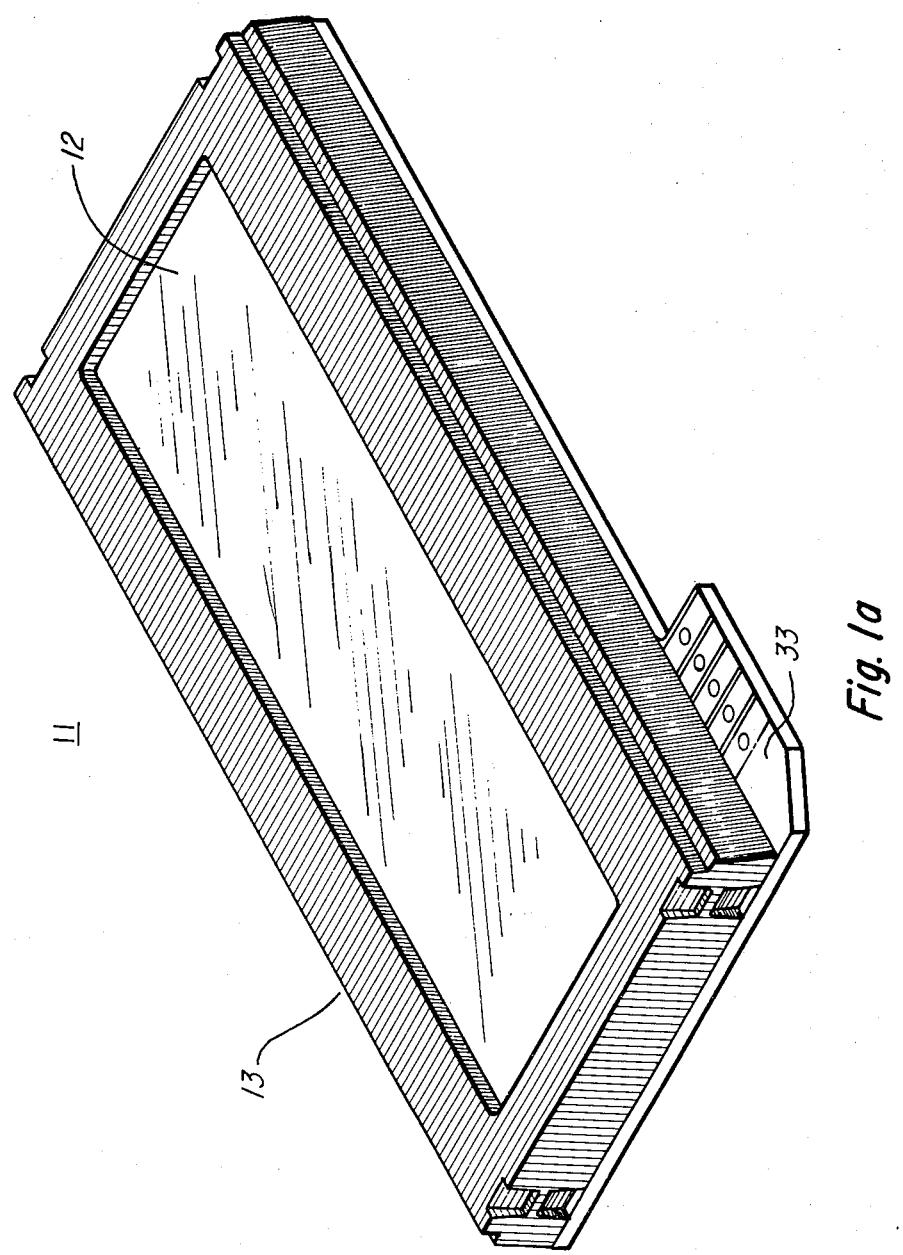
FIGS. 1a and 1b are perspective views of the display system of the present invention respectively showing a liquid crystal display visible within a base member on one side and a printed circuit board affixed to the base member on the opposite side.
Figure 1B:
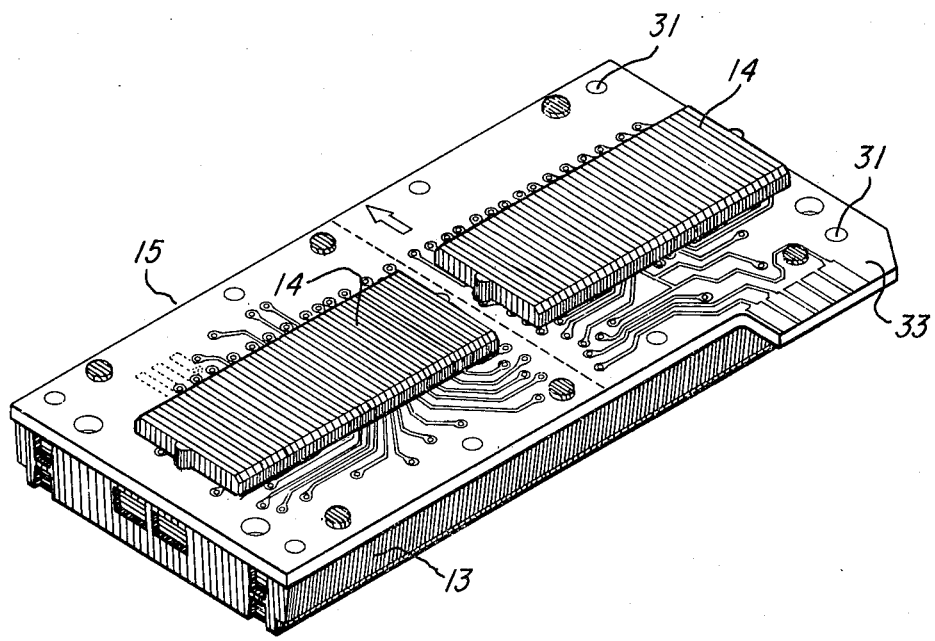

FIG. 1a shows a modular display system 11 in which a liquid crystal display (LCD) 12 having a plurality of electrical terminals formed on a substrate thereof is mounted in a base member 13 so that LCD 12 is visible from one side of base member 13. Referring also to FIG. 1b, LCD 12 is electrically coupled to two integrated circuits 14 by means of an insulative substrate such as a printed circuit board (PCB) 15 which is fastened to base member 13 on the opposite side from which LCD 12 is visible to form an integral display package in which precise alignment is achieved between LCD 12 and PCB 15 for reliable electrical contact therebetween.

Figure 2:
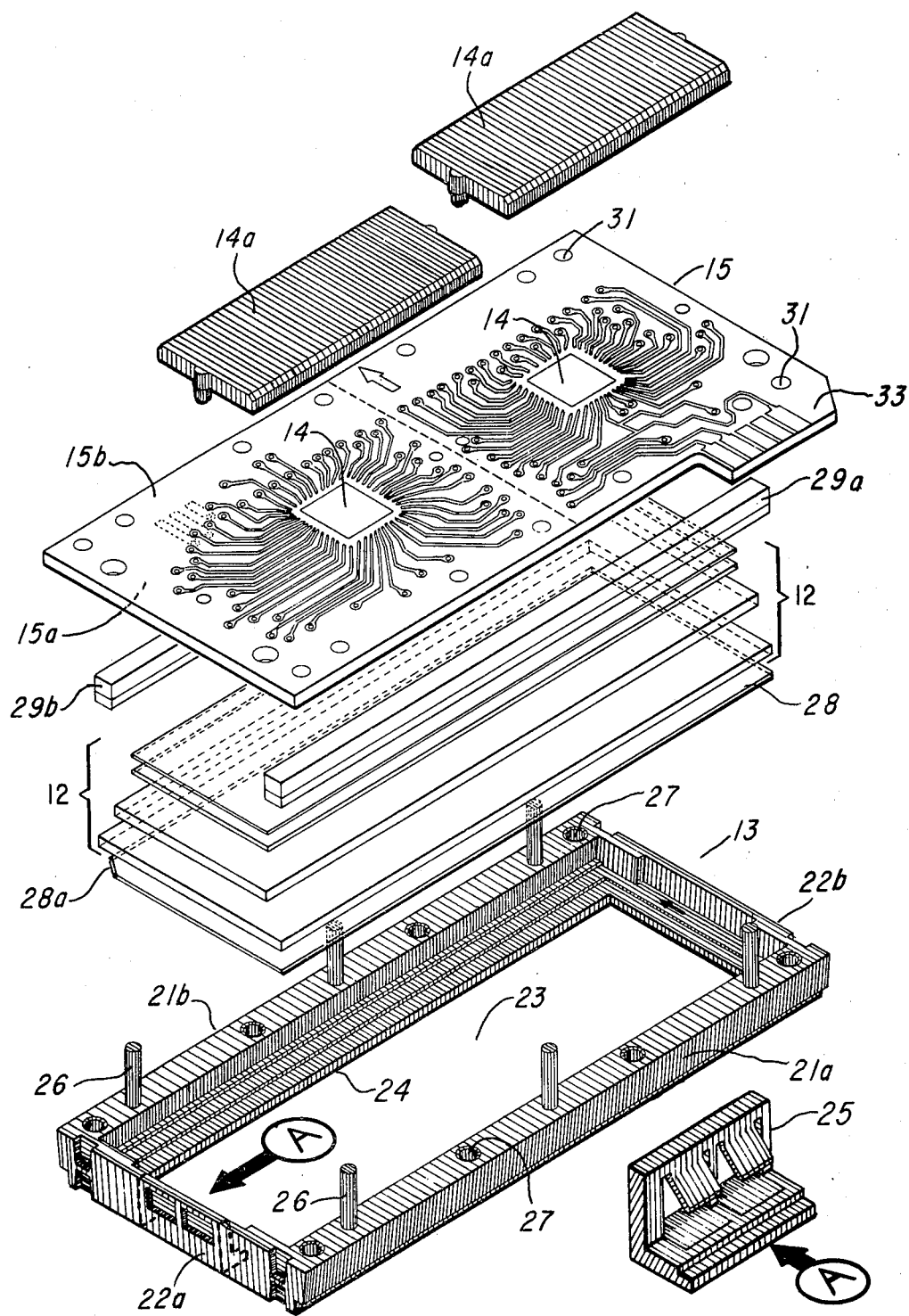
FIG. 2 is a perspective view of the individual components comprising the display system of FIGS. 1a and 1b.

FIG. 2 shows the components which comprise display system 11 and the various alignment features associated therewith. Base member 13 is preferably a rectangular-shaped member having a pair of side members 21a and 21b and a pair of end members 22a and 22b interconnected to form a hollow chamber 23 therebetween. Each of the side members and end members has a ridge member 24 projecting therefrom into chamber 23 for supporting LCD 12 in a fixed position within base member 13. End member 22a further includes a wedge-shaped spring member 25 projecting therefrom into chamber 23 for biasing LCD 12 toward end member 22b, which provides a reference position for aligning LCD 12. The use of spring member 25 provides additional flexibility of the selection of display dimensions while maintaining precise alignment of LCD 12. End member 22b has an arrow indicator marked thereon to facilitate proper orientation of LCD 12 and PCB 15 with respect to base member 13. Side members 21a and 21b each have three alignment posts 26 extending vertically therefrom and four openings 27 therein for cooperating with corresponding alignment features of PCB 15 as will be described below.

Display system 11 is assembled by first placing a polarizer sheet 28 in base member 13 so that light entering and leaving LCD 12 is polarized for optimum viewing characteristics. One corner 28a of polarizer 28 is cut diagonally to serve as a reference point for properly orienting polarizer 28 with respect to base member 13. LCD 12 is then loaded into base member 13 and biased toward the reference position of end member 22b by spring member 25. LCD 12 preferably includes a reference indicator (not shown), such as an arrow, marked thereon to facilitate proper orientation thereof with respect to base member 13.

A pair of compressible rubber strips 29a and 29b with respective patterns of conductors formed on a surface thereof are disposed adjacent to LCD 12 and on opposite sides thereof so that the conductors are in electrical contact with respective electrical terminals of LCD 12. In another feature of the invention, a portion of both rubber strips 29a and 29b equivalent to approximately 10-30% of the thickness thereof extends above LCD 12 in a direction toward PCB 15 so that when PCB 15 is fastened to base member 13, PCB 15 will exert biasing pressure on LCD 12 by means of compressible strips 29a and 29b, thereby maintaining LCD 12 in a rigid position and providing sufficient contact pressure between PCB 15 and LCD 12 for reliable electrical contact therebetween.

PCB 15 has a plurality of electrical conductors formed on a surface 15a thereof for engaging the conductors of rubber strips 29a and 29b. An electrical circuit, which may include one or more integrated circuits 14 packaged within covers 14a for controlling the operation of LCD 12, is mounted on opposite side 15b of PCB 15 and electrically coupled to the electrical conductors on side 15a. PCB 15 further includes a plurality of openings 31 extending therethrough for being positioned in registration with respective alignment posts 26 or, alternatively, with respective openings 27 in base member 13. The primary means of fastening PCB 15 and base member 13 together is by mating alignment posts 26 with respective openings 31 and staking posts 26 so that PCB 15 is held rigidly against base member 13. When PCB 15 is affixed to base member 13, the electrical conductors on side 15a engage the conductors of rubber strips 29a and 29b, thereby electrically coupling PCB 15 to LCD 12. Pressure is exerted on PCB 15 by the staked posts to bias it toward LCD 12, thereby compressing rubber strips 29a and 29b and applying sufficient contact pressure between PCB 15 and LCD 12 to effect and maintain good and reliable electrical contact therebetween. Electrical contact is therefore maintained between LCD 12 and an external circuit such as integrated circuit 14. PCB 15 preferably has a reference indicator marked thereon for facilitating orientation thereof with respect to base member 13.

In an alternative embodiment PCB 15 is comprised of multiple printed circuit boards each having an integrated circuit 14 associated therewith. By rearranging posts 26 and openings 27 in base member 13, base member 13 is able to accomodate multiple printed circuit boards. For example, the two integrated circuits 14 shown in FIG. 2 may be disposed on two separate printed circuit boards (indicated by the dashed line on PCB 15) so that each integrated circuit 14 can be separately interconnected with LCD 12 to facilitate assembly, repair and replacement. Each printed circuit board is preferably connected to base member 13 by means of four alignment posts 26 so that base member 13 is refitted to include eight alignment posts 26.

Figure 3:
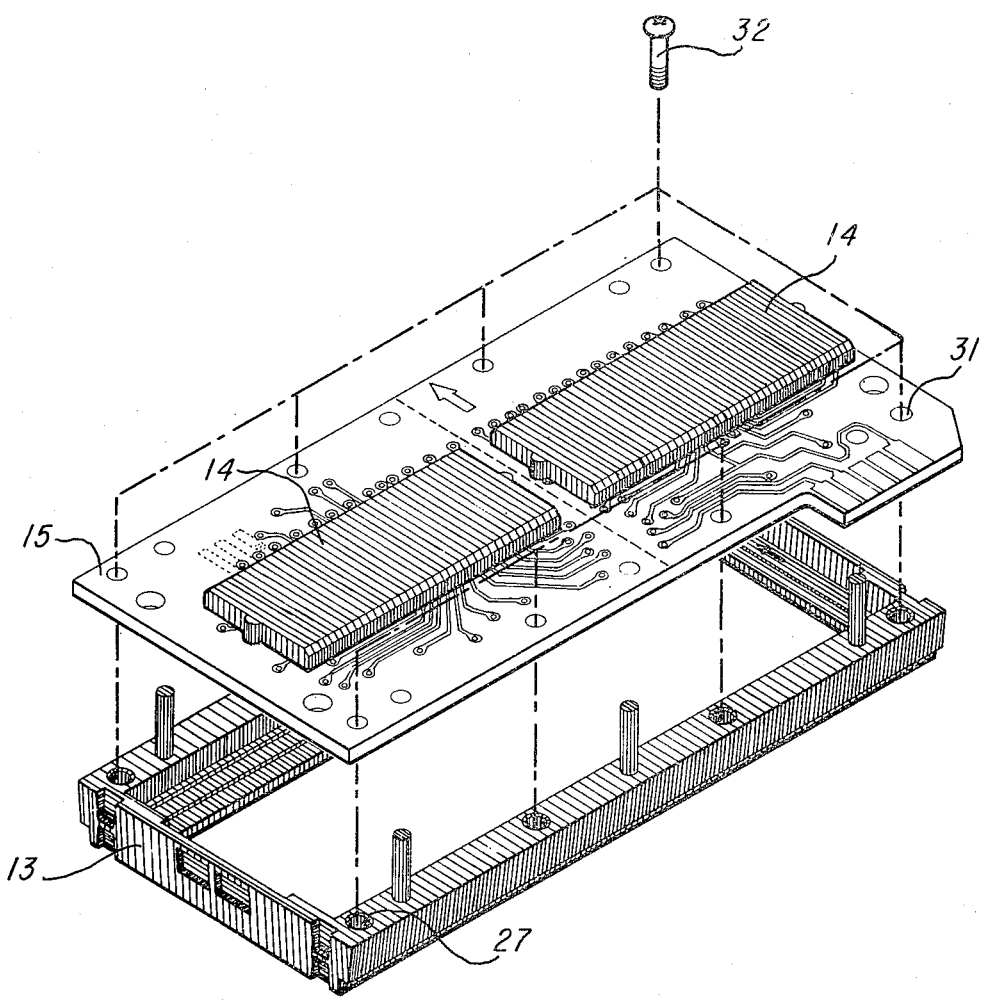
FIG. 3 shows a printed circuit board being affixed to the base member by means of screws.

In another feature of the invention, repair and replacement of display system 11 and associated components are facilitated by including a secondary means of affixing PCB 15 and base member 13 together. If it is desired to disassemble display system 11 for repair and/or replacement, posts 26 are cut and PCB 15 is disengaged from base member 13. Once repair and/or replacement is completed, the unit is reassembled by lining up selected openings 31 in PCB 15 with respective openings 27 in base member 13 and inserting a screw member 32 into each respective pair of openings for locking PCB 15 and base member 13 together, as shown in FIG. 3. Screw members 32 are removable to facilitate subsequent repair and/or replacement.

Figure 4:
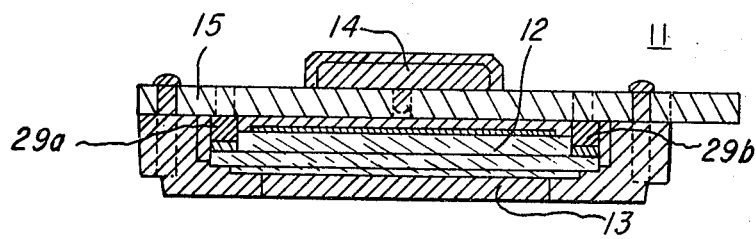
FIG. 4 is a cross-sectional view of the display system of the present invention.
Figure 5:
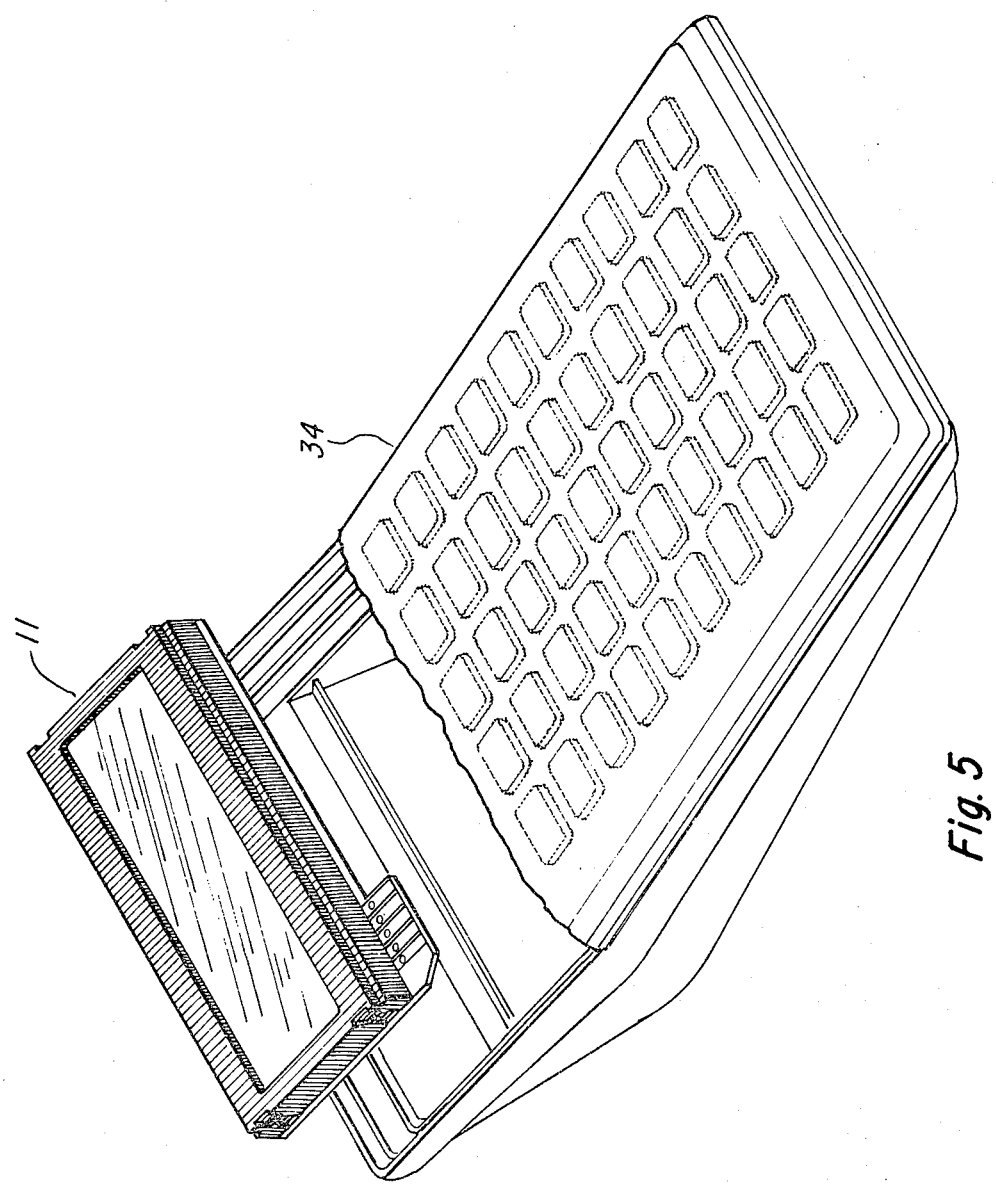
FIG. 5 shows the display system of the present invention being inserted into an electronic calculator.

A cross-section of display system 11 as assembled is shown in FIG. 4. LCD 12 is mounted in base member 13 with rubber strips 29a and 29b positioned adjacent to LCD 12 and on opposite sides thereof. Display system 11 is preferably inserted as a modular unit into an electronic system 34 such as an electronic calculator, as shown in FIG. 5. Display system 11 is electrically interfaced with the electronic system by means of conductive pads formed on an extension portion 33 of PCB 15 (see FIG. 1a).

Although the invention has been described with reference to a liquid crystal display, it will be recognized by those skilled in the art that the present invention in applicable to other electrically-responsive displays, such as, for example, gas discharge displays and vacuum fluorescent displays, which are capable of being mounted in a rigid frame and aligned with respect to an external electrical circuit. The display system of the present invention provides a modular display package having a self-aligning capability which solves the problems of precisely aligning a display with respect to an external device such as a printed circuit board and applying sufficient mechanical pressure to effect and maintain good and reliable electrical contact between the display and printed circuit board. The alignment system of the present invention is particularly well-suited for complex liquid crystal displays having a high density conductive pattern formed thereon for which precise alignment is critical. The modular display system of the present invention has the further advantage of facilitating assembly testing, repair and replacement of the display and associated components because the unit can be tested for proper operation prior to being integrated into an electronic system.

Various embodiments of the invention have now been described in detail. Since it is obvious that many changes and modifications can be made in the above details without departing from the nature and spirit of the invention, it is understood that the invention is not to be limited to these details except as set forth in the appended claims.

What is claimed is:

1. A system for aligning an electrically-responsive display device having a plurality of electrically conductive terminals with respect to a substrate member to effectuate electrical interconnection between said display device and an electrical circuit member mounted on said substrate member, said system comprising:

(a) an insulative substrate member having a plurality of electrical conductors formed thereon, each of said electrical conductors being electrically connected to said electrical circuit, said substrate member further including a plurality of openings extending therethrough;
    (b) spacer material having a pattern of electrical conductors on a surface thereof, said spacer member being disposed adjacent to said substrate member with said electrical conductors on said surface thereof in electrical contact with respective ones of said plurality of electrical conductors of said substrate member; and
    (c) a base member for retaining said display device in a fixed position between said base member and said insulative substrate member, said base member including a plurality of alignment posts extending outwardly therefrom for mating with respective openings of said substrate member, said base member being mechanically biased toward said substrate member thereby biasing said display device toward said spacer material and said spacer material toward said substrate member for electrically connecting said electrically conductive terminals to said electrical conductors of said spacer material thereby electrically connecting said electrically conductive terminals to respective ones of said electrical conductors of said substrate member and for mechanically holding said display device, said base member further including a flexible spring member for exerting biasing pressure on said display device in a direction perpendicular to said biasing of said display device toward said substrate member to maintain said display device in a fixed position with respect to a predetermined reference position on said base member thereby facilitating alignment of said display device with said substrate member.

2. The system according to claim 1 wherein said biasing pressure of said flexible spring member is exerted in a direction parallel to a major surface of said display device.

3. The system according to claim 1 wherein said base member has a reference indicator marked thereon for indicating the proper orientation of said display device and said substrate member with respect thereto.

4. The system according to claim 1 wherein said base member is of rectangular dimensions having two side members and two end members interconnected to form a hollow chamber therebetween for receiving the display device therein, said side members being longer than said end members.

5. The system according to claim 4 wherein each of the side members and end members includes a ridge member projecting therefrom into said chamber along at least a portion of each side member and end member for supporting said display device within said chamber.

6. The system according to claim 4 wherein each of said side members has three alignment posts extending outwardly therefrom in a direction perpendicular to a major surface of the display device.

7. The system according to claim 4 wherein each of said side members has four alignment posts extending outwardly therefrom in a direction perpendicular to a major surface of the display device.

8. The system according to claim 4 wherein said flexible spring member is disposed on one of said end members and projects therefrom into said chamber for biasing said display device toward the other end member thereby maintaining said display device in a fixed position with respect to said other end member.

9. The system according to claim 8 wherein said spring member is a wedge-shaped tab member comprised of a plastic material.

10. A method of aligning an electrically responsive display device having a plurality of electrically conductive terminals with respect to a substrate member to effect electrical contact between the terminals of said display device and an electrical circuit mounted on said substrate member, said method comprising the steps of:
   (a) providing a base member having a plurality of alignment posts extending outwardly therefrom for retaining said display device in a fixed position therein;
   (b) positioning said display device in a predetermined position within said base member;
   (c) placing spacer material having a pattern of electrical conductors on a surface thereof adjacent to said display device within said base member with said conductors in electrical contact with the terminals of said display device;
   (d) providing an insulative substrate member having a plurality of electrical conductors thereon, each of said electrical conductors being electrically connected to said electrical circuit, said substrate member further including a plurality of openings extending therethrough; and
   (e) positioning said substrate member so that said openings are in mating engagement with said alignment posts and said display device is between said base member and said insulative substrate member and mechanically biasing said substrate member toward said base member thereby biasing said display device toward said spacer material and said spacer material toward said substrate member, for electrically connecting said electrical conductors of said substrate member with selected ones of the electrical conductors of said spacer material, thereby electrically interconnecting the terminals of said display device with said electrical circuit and for mechanically holding said display device.

11. A system for aligning an electrically-responsive display device having a plurality of electrically conductive terminals with respect to a substrate member to effectuate electrical interconnection between said display device and an electrical circuit member mounted on said substrate member, said system comprising:
   (a) an insulative substrate member having a plurality of electrical conductors formed thereon, each of said electrical conductors being electrically connected to said electrical circuit, said substrate member further including a plurality of openings extending therethrough;
   (b) spacer material having a pattern of electrical conductors on a surface thereof, said spacer material being disposed adjacent to said substrate member with said electrical conductors on said surface thereof in electrical contact with respective ones of said plurality of electrical conductors of said substrate member; and
   (c) a base member for retaining said display device in a fixed position between said base member and said insulative substrate member, said base member including a plurality of alignment posts extending outwardly therefrom for mating with respective openings of said substrate member, said base member being mechanically biased toward said substrate member thereby biasing said display device toward said spacer material and said spacer material toward said substrate member for electrically connecting said electrically conductive terminals to said electrical conductors of said spacer material thereby electrically connecting said electrically conductive terminals to respective ones of said electrical conductors of said substrate member and for mechanically holding said display device.

12. The system according to claim 11 wherein said display device is a liquid crystal display and said substrate member is a printed circuit board.

13. The system according to claim 12 wherein said liquid crystal display is of the twisted nematic type having a polarizer sheet associated therewith.

14. The system according to claim 11 wherein said spacer material is comprised of a pair of rubber strips each having a respective pattern of conductors on a surface thereof, said rubber strips being positioned in contact with said display device on opposite sides thereof so that the conductors of each strip are in electrical contact with respective electrical terminals of the display device.

15. The system according to claim 11 wherein said alignment posts are staked for mechanically biasing said base member toward said substrate member to hold said substrate member in a fixed position with respect to said base member.

16. The system according to claim 11 wherein said base member includes a plurality of openings positioned along the perimeter thereof in registration with respective openings in said substrate member for allowing the substrate member and base member to be affixed together by means of screw members, said screw members being removable to permit disengagement of said substrate member from said base member.

17. A system comprising:
   (a) a liquid crystal display device having a plurality of electrically conductive terminal members on a substrate thereof;
   (b) an electrically insulative circuit board having a plurality of openings extending therethrough, said circuit board having a plurality of electrical conductors on a surface thereof;
   (c) first and second compressible spacer members positioned in contact with said circuit board, said spacer members each having a pattern of conductors formed on the surface thereof, said conductors being in electrical contact with respective ones of said plurality of electrical conductors of said circuit board;
   (d) a base member for retaining said display device in a fixed position between said base member and said electrically insulative circuit board, said base member including a plurality of alignment ports extending outwardly therefrom for mating with respective openings of said circuit board, said base member being mechanically biased toward said circuit board thereby biasing said display device toward said spacer members and said spacer members toward said circuit board for electrically connecting said terminal members to said conductors of said spacer members thereby electrically connecting said terminal members to said electrical conductors of said circuit board and for mechanically holding said display device; and (e) at least one circuit member mounted on said circuit board and electrically connected to said plurality of electrical conductors of said circuit board for controlling operation of said liquid crystal display device.

18. The system according to claim 17 wherein said alignment posts are staked for mechanically biasing said base member toward said circuit board to hold said circuit board in a fixed position with respect to said base member.

19. The system according to claim 17 wherein said at least one circuit element is mounted on a surface of the circuit board opposite to the surface thereof which is in contact with the first and second spacer members.

20. The system according to claim 19 wherein said at least one circuit element is comprised of two integrated circuits.

21. The system according to claim 17 wherein said base member includes a plurality of openings positioned along the perimeter thereof in registration with respective openings in said circuit board for allowing the circuit board and base member to be affixed together by means of screw members, said screw members being removable to permit disengagement of said circuit board from said base member.

22. An electronic calculator having input means for entering information into said calculator, memory means for storing information entered into said calculator by said input means, computing means for performing numerical computations in accordance with the information in said memory means and display means for displaying information entered and results of computations wherein said display means comprises:
  (a) a liquid crystal display device having a plurality of electrically conductive terminal members on a substrate thereof;
  (b) an electrically insulative circuit board having a plurality of openings extending therethrough, said circuit board having a plurality of electrical conductors on a surface thereof;
  (c) first and second compressible spacer members positioned in contact with said circuit board, said spacer members each having a pattern of conductors formed on the surface thereof, said conductors being in electrical contact with respective ones of said plurality of electrical conductors of said circuit board;
  (d) a base member for retaining said display device in a fixed position between said base member and said electrically insulative circuit board, said base member including a plurality of alignment ports extending outwardly therefrom for mating with respective openings of said circuit board, said base member being mechanically biased toward said circuit board thereby biasing said display device toward said spacer members and said spacer members toward said circuit board for electrically connecting said terminal members to said conductors of said spacer members thereby electrically connecting said terminal members to said electrical conductors of said circuit board and for mechanically holding said display device; and
  (e) at least one circuit member mounted on said circuit board and electrically connected to said plurality of electrical conductors of said circuit board for controlling operation of said liquid crystal display device.

23. A system comprising:
  (a) a liquid crystal display device having a plurality of electrically conductive terminal members on a substrate thereof;
  (b) an electrically insulative circuit board having a plurality of openings extending therethrough, said circuit board having a plurality of electrical conductors on a surface thereof;
  (c) first and second compressible spacer members positioned in contact with said circuit board, said spacer members each having a pattern of conductors formed on the surface thereof, said conductors being in electrical contact with respective ones of said plurality of electrical conductors of said circuit board;
  (d) a base member for retaining said display device in a fixed position between said base member and said electrically insulative circuit board, said base member including a plurality of alignment posts extending outwardly therefrom for mating with respective openings of said circuit board, said base member being mechanically biased toward said circuit board thereby biasing said display device toward said spacer members and said spacer members toward said circuit board for electrically connecting said terminal members to said conductors of said spacer members thereby electrically connecting said terminal members to said electrical conductors of said circuit board and for mechanically holding said display device, said base member further including a flexible spring member for exerting biasing pressure on said display device in a direction perpendicular to said biasing of said display device toward said substrate member to maintain said display device in a fixed position with respect to a predetermined reference position on said base member thereby facilitating alignment of said display device with said substrate member; and
  (e) at least one circuit member mounted on said circuit board and electrically connected to said plurality of electrical conductors of said circuit board for controlling operation of said liquid crystal display device.

* * * * *